(12) United States Patent
Rubin et al.

(10) Patent No.: US 6,255,662 B1
(45) Date of Patent: Jul. 3, 2001

(54) RUTHERFORD BACKSCATTERING DETECTION FOR USE IN ION IMPLANTATION

(75) Inventors: Leonard Michael Rubin, Peabody, MA (US); Shaun Dean Wilson, Newfields, NH (US); Yuri Erokhin, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/179,314

(22) Filed: Oct. 27, 1998

(51) Int. Cl.[7] .............................. H01J 37/30; H01J 37/304
(52) U.S. Cl. .................................. 250/492.21; 250/397
(58) Field of Search ........................ 250/492.21, 397, 250/398, 252.1

(56) References Cited

U.S. PATENT DOCUMENTS

| | | | |
|---|---|---|---|
| H000235 | * 3/1987 | Kugel et al. | 376/143 |
| 4,459,739 | * 7/1984 | Shephard et al. | 29/571 |
| 4,667,111 | 5/1987 | Glavish et al. | 250/492.2 |
| 4,805,187 | * 2/1989 | Harbeke et al. | 374/123 |
| 4,966,885 | * 10/1990 | Hebard | 505/1 |
| 4,967,078 | 10/1990 | Purser | 250/309 |
| 4,982,090 | * 1/1991 | Wittmacck | 250/309 |
| 5,059,785 | * 10/1991 | Doyle et al. | 350/309 |
| 5,432,352 | 7/1995 | van Bavel | 250/492.21 |
| 5,753,923 | * 5/1998 | Mera et al. | 250/492.21 |
| 5,898,179 | * 4/1999 | Smick et al. | 250/492.21 |
| 5,981,961 | * 11/1999 | Edwards et al. | 250/492.21 |
| 5,998,798 | * 12/1999 | Halling | 250/252.1 |
| 6,031,240 | * 2/2000 | Kodama | 250/492.21 |

* cited by examiner

Primary Examiner—Bruce C. Anderson
(74) Attorney, Agent, or Firm—Watts, Hoffman, Fisher & Heinke, Co., L.P.A.

(57) ABSTRACT

A Rutherford backscattering detector for determining the angle of incidence between an ion beam and the crystalline lattice structure of a semiconductor workpiece. A process chamber defines a chamber interior into which one or more workpieces can be inserted for ion treatment, and a rotating workpiece support is disposed within the process chamber for mounting one or more semiconductor workpieces. An energy source sets up an ion plasma from which is created an ion beam which is caused to impact the surface of the semiconductor workpiece. A Rutherford backscattering detector measures the intensity of backscattered particles and the backscattered ion intensity is correlated to an angle of incidence between the ion beam and the crystalline structure of the semiconductor workpiece.

21 Claims, 3 Drawing Sheets

RUTHERFORD BACKSCATTERING DETECTION FOR USE IN ION IMPLANTATION

FIELD OF THE INVENTION

The present invention concerns a detector for use with an ion implanter for treating a workpiece such as a silicon wafer.

BACKGROUND ART

One commercially available ion implantation system uses an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions which strike the wafers to penetrate those wafers in the implantation chamber. In a typical application of such a system the wafers are silicon wafers and the ions are used to "dope" the wafers to create a semiconductor material. Selective implantation with the use of masks and passivation layers allows an integrated circuit to be fabricated.

Rutherford Backscattering Spectroscopy (RBS) is a known technique for analyzing the energy and yield of backscattered ions impinging a target. Known methods of RBS are performed on stationary materials in a laboratory setting for determining the crystalline structure of the material. U.S. Pat. No. 4,967,078 to Purser entitled "Rutherford Backscattering Surface Analyzer with 180-Degree Deflecting and Focusing Permanent Magnet" discloses a RBS analyzer suitable for use in a research laboratory setting. The apparatus of the '078 patent generates a 2.0 MeV ion beam which is directed onto a sample. An RBS detector counts the ions deflected from the sample. Dedicated RBS software then generates a backscattering spectrum from the sample.

Semiconductor materials such as silicon are used in fabricating electronic devices because of their crystalline structure. Materials have a crystalline structure when their atoms are arranged in three dimensions in a regular manner, known as a crystalline lattice. Silicon wafers used in the fabrication of electronic devices are made from large single crystals of silicon specially grown for that purpose. Crystalline structure is advantageous in electronic devices because it facilitates control of the electrical properties of the device and exhibits uniform electrical properties throughout the entire material. Finally, because impurities which degrade device performance tend to collect around irregularities in the atomic structure of a material, regular crystalline structure promotes optimum device performance and yield.

An important parameter of a semiconductor wafer ion implant process is the angle of incidence of the ion beam with respect to the wafer and internal lattice structure of the semiconductor material of the wafer. The angle of incidence is important because of the role it plays in the phenomenon of channeling. Dopant depth profiles vary as a function of position on the wafer surface if the incident angle of the beam varies across the surface. U.S. Pat. No. 5,432,352 to van Bavel entitled "Ion Beam Scan Control" discloses a method for compensating for deviations in the angle of incidence between the ion beam and the semiconductor wafer during ion beam scanning. This patent concerns the use of a variable speed motor which scans the semiconductor wafer through the ion beam. The motor varies the speed of the scan as a function of the predicted angle of incidence between the ion beam and the wafer. Systems such as the one disclosed by van Bavel rely on assumptions about the precision of the wafer cut with respect to the lattice structure of the silicon crystal and assume a perfectly straight ion beam.

DISCLOSURE OF THE INVENTION

The present invention concerns the use of Rutherford Backscattering Spectroscopy to calibrate the orientation of a workpiece support in ion implantation systems. In ion implantation, the relative position of the ion beam to the crystalline structure of the workpiece is important to achieve effective implantation. It is usually not desirable to have an ion beam impact the crystalline lattice structure at a precise 90 degree angle because this causes a phenomenon known as channeling. Channeling degrades the implant profile because it allows implanted ions to penetrate into the workpiece in an unpredictable manner. For the crystalline structure of silicon, ideal implantation occurs when the ion beam impacts the crystalline structure at an angle within a few degrees of 90 degrees, but not exactly 90 degrees. At this orientation, the amount of ions imbedded into the crystalline structure is maximized, while channeling is minimized.

When an ion beam impacts a crystalline structure such as silicon, the number of ions deflected back ("backscattered") is related to the angle at which the ion beam is impacting the silicon lattice structure. For example, when the beam impacts the lattice structure at exactly 90 degrees, the number of ions deflected back off ("backscattered") is minimized. In accordance with the present invention, RBS may be used to measure the intensity of backscattered ions to determine the angle of incidence between the ion beam and the silicon wafer. In a production environment, the technique of the present invention may be used to check that the angle of implantation has remained constant and adjustments may be made to a workpiece support orientation if the angle has changed due to crystal cut of the wafers or ion beam path variations.

The use of RBS techniques which measure backscattering of ions from a stationary workpiece are not suitable for calibration for ion implantation processing runs because during a process run, the workpiece support is rotating. This rotation changes the angle of incidence between the beam and the crystalline structure. Without the benefit of the present invention, calibration of the workpiece support for processing runs is made by assuming a given crystalline structure orientation and a perfectly straight ion beam impact. These assumptions introduce error into the calibration procedure. The present invention allows for RBS to be used in calibration of workpiece support position while the support is rotating, thereby directly measuring the angle of incidence between the ion beam and the crystalline structure of the workpiece. The technique greatly improves the accuracy of the positioning of the workpiece relative to the ion beam and enhances the quality of ion implantation.

The present invention includes a process chamber into which one or more workpieces are inserted and mounted on a rotating workpiece support. The orientation of the workpiece support is adjustable around one or two axes. An energy source sets up an ion plasma used to create an ion beam directed at the workpiece. The ion beam impacts the workpiece and ions are either imbedded into the workpiece or are backscattered. An RBS detector measures the intensity of these backscattered ions. During set up or calibration of an ion implantation system, the workpiece is mounted on the support and an ion beam is directed at the workpiece while the workpiece support is rotated as it does during ion implantation. The intensity of the backscattered ions is measured by the RBS detector and the workpiece support orientation is adjusted until a minimum backscattered intensity is found. The minimum backscattered intensity indicates that the workpiece is at an orientation which corresponds to a 90 degree angle of implantation. This orientation is then used as a reference point for subsequent adjustments to the workpiece support to yield a desired angle of implantation. In subsequent set ups or calibration procedures, a new reference point is located using the RBS detector.

An exemplary embodiment of the present invention features a RBS detector which has a rotatable cover with an entry slit which limits the surface of the detector exposed to the backscattered ions. The cover is rotated via a cable to expose new surface areas of the detector as other surfaces are worn out. The RBS detector is controlled by a control means which includes an electronic filter which compensates for the effects of the rotating workpiece support. The electronic filter may be used to record RBS data generated when the ion beam impacts the center of a single wafer or may average RBS data generated when the ion beam impacts the center of each of multiple wafers on the support. Restricting the data to data from the center of the wafers improves the sharpness of the signal. Analyzing data from a single wafer may be used to gather information about variations between mounting locations on the workpiece support.

In another embodiment of the present invention, the RBS detector is used as an independent check on ion beam energy. In this embodiment, a test workpiece coated with a thin layer (around 100 angstroms) of implant compatible metal coating such as lead or tungsten is impacted by an ion beam. For a constant beam current, the RBS backscatttering yield is measured as a function of the wafer orientation. The highest measured backscattered energy is from ions scattered from the head-on collisions between ions in the beam and the atoms of the target surface. This is equal to a constant fraction of the initial ion energy. The constant depends on the mass of the target atom, the mass of the incident ion, and the angle of the detector. For example, for a silicon wafer coated with tungsten, at normal incidence, the kinematic factor for a boron beam is about 0.80. Therefore, in this example, the energy of the ion beam is equal to the highest measured backscattered energy divided by 0.80, the kinematic factor for boron.

These and other objects, advantages and features of the invention are described in greater detail in conjunction with the accompanying drawings.

BEST MODE FOR CARRYING OUT THE INVENTION

Figure 1:
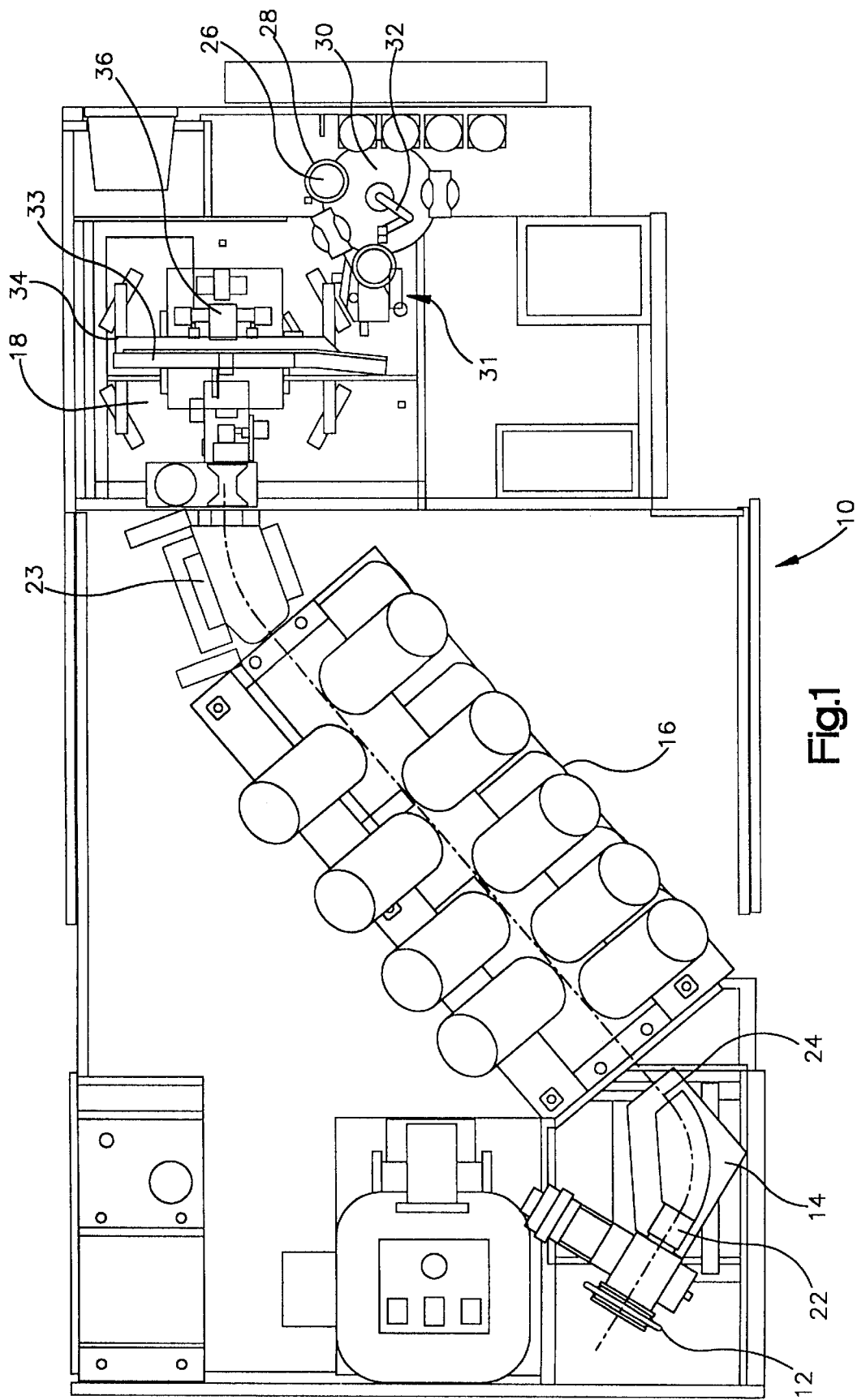
FIG. 1 is a schematic of an ion implantation system.

Turning now to the drawings, FIG. 1 shows an ion implantation system 10 for directing high energy ions at a target. The system includes an ion source 12, an analyzing magnet 14, a high energy beam accelerator 16, and an implantation station 18.

Ions from the source are accelerated to an energy of from between 20 kev and 80 kev by a static field producing electrode assembly 22, then resolved by the magnet 14 into a uniform ion beam 24. The accelerator 16 receives the beam 24 and accelerates the ions to much higher energies ranging from 200 kev to 2 Mev. Further details of such an accelerator are found in U.S. pat. No. 4,667,111. High energy ions leave the accelerator 16 and are focused by a final energy magnet 23.

The implantation station 18 shown in FIG. 1 is specifically arranged for ion implantation of semiconductor wafers 26. At a load/unload station 28, a technician or an automated device positions the wafers 26 about the periphery of a rotating workpiece support 30. A disk orienter positioned next to the support 30 orients the wafers and the support 30 moves the wafers to a transfer station 31. At the transfer station disks are moved via disk exchange arms 32 to a vacuum process chamber 34. A rotating support 33 within the chamber 34 and wafers attached to the support are oriented to cause highly accelerated ions to impinge upon the wafers 26. A motor 36 rotates the support 33 and a separate drive (not shown) translates both the motor 36 and support 33 so the ions sweep across the rotating disk. Control of motor rotation and translation of the support 30 with respect to the ion beam allow doping concentration to be controlled and in particular allow uniform implantation concentration to be achieved.

Figure 2:
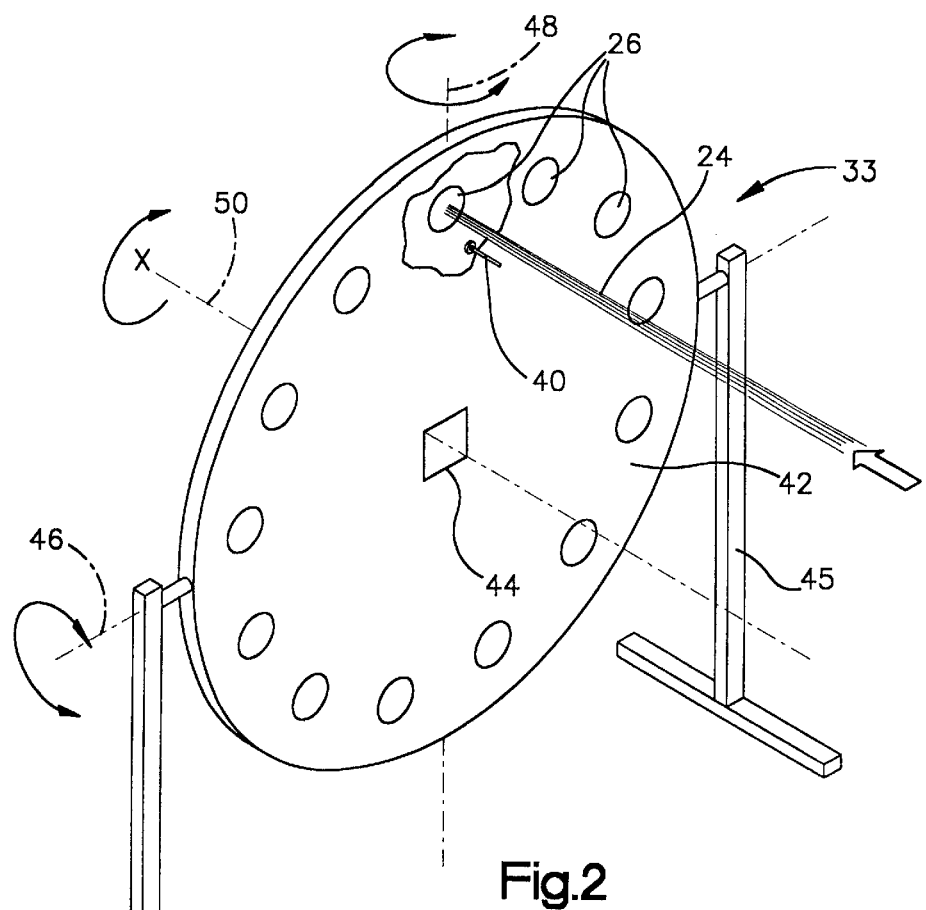
FIG. 2 is a perspective view of a workpiece support for the ion implantation system depicting multiple silicon wafers being treated with ions and a RBS detector of the present invention.

Referring now to FIG. 2, the workpiece support 33 is shown in more detail. The workpiece support includes a mounting disk 42 and mounting legs 45. Silicon wafers 26 are mounted on the mounting disk 42. During set up, the mounting disk 42 may be adjusted around an first twist direction 46 and a second twist direction 48 and then fixed in the set up position. During processing, the ion beam 24 impacts the wafers 26 as the mounting disk 42 is rotated about an x scan axis 50 by the motor 36. In addition to rotating about the x scan axis, the mounting disk 42 is raised and lowered along direction generally parallel to the second twist direction 48 by a drive means (not shown). The combination of movements in the x and y direction causes the entire surface of each wafer 26 to be impacted by the ion beam 24.

Figure 3:
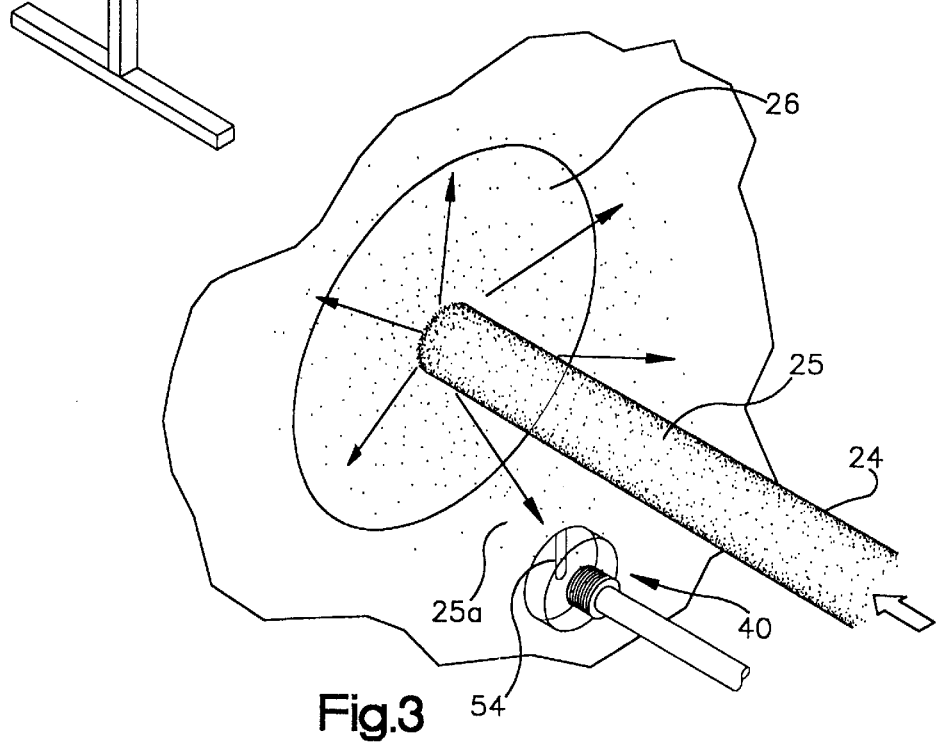
FIG. 3 is an enlarged fragmentary perspective view of a silicon workpiece being treated with ions and a RBS detector of the present invention.
Figure 4:
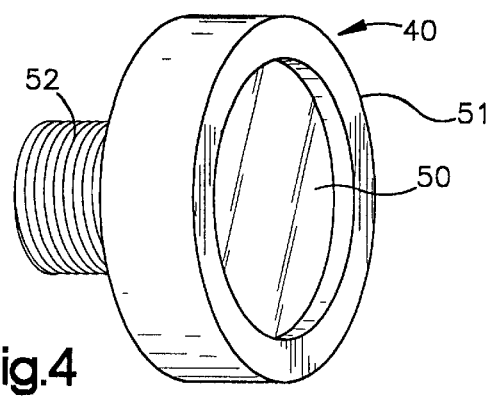
FIG. 4 is a perspective view of a RBS detector of the present invention.

Referring to FIG. 3, when the ion beam 24 impacts the wafer 26 a proportion of the ion beam ions 25 are imbedded in the crystalline lattice structure of the wafer material, such as silicon. Ions which are not imbedded in the wafer (designated by numeral 25a) are deflected back, or backscattered, from the wafer. A Rutherford Backscattering Spectroscopy (RBS) detector 40 is positioned above the surface of the wafer 26 slightly offset from the ion beam 24 to avoid interfering with the ion beam. Many commercially available RBS detectors would be suitable for use with the present invention, for example EG&G Instruments model BU-014-025-100 is an appropriate RBS detector. The RBS detector 40 includes an entrance window 51 (FIG. 4) defining a radiation a detecting surface 50. Each time a particle impacts the detecting surface 50, electronic sensors located in a sensor housing register a count. See FIG. 4. Backscattered ions 25a impact the detecting surface 50 and are registered by the electronic sensors in the sensor housing 52. As already discussed, this intensity of these backscattered ions give an indication of the angle of incidence between the ion beam 24 and the crystal lattice structure of the wafer 26.

Figure 4A:
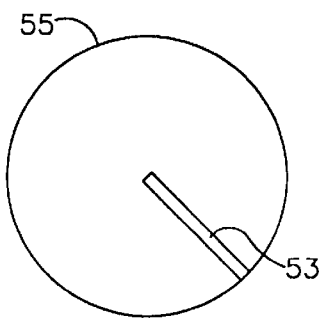

Another embodiment of the present invention includes a cover for the RBS detector window 51 and are shown in FIG. 4a. FIG. 4a shows a cover 55 having a rotatable radial slit 53. The cover 55 protects the detecting surface 50 from overexposure to backscattered ions. As areas of the detecting surface 50 are worn out, the cover 55 may be rotated to expose a fresh area of the detecting surface. A time synchronized electronic filter (not shown) may be used to limit data recordation to data taken when the ion beam is impacting a given portion of one or more wafers to produce a sharper signal.

Figure 5:
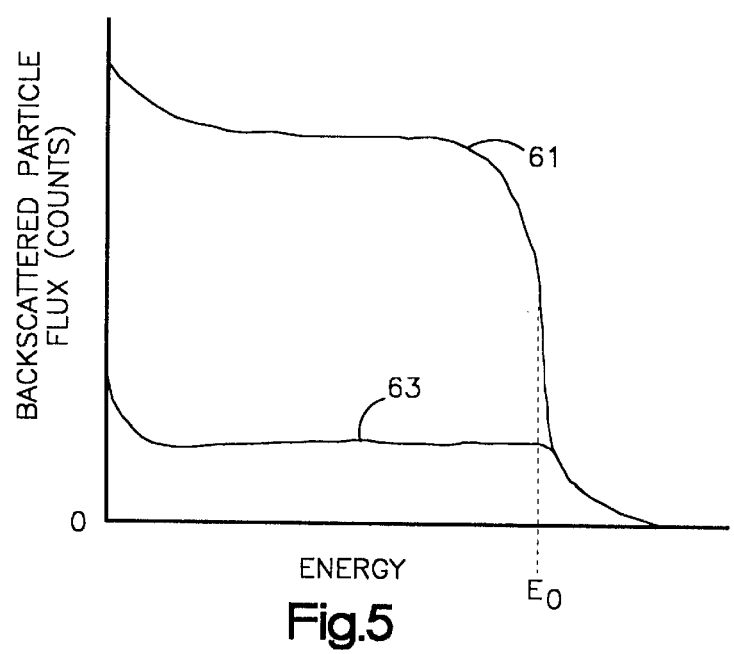
FIG. 5 is a graph depicting backscattered particle flux as a function of ion beam energy.

FIG. 5 is a graph showing the relationship between the backscattered particle flux, the energy of the ion beam, and the orientation of the wafer. Curve 61 designates backscattered radiation intensity as a function of beam energy at a wafer orientation that minimizes channeling. As can be seen, the backscattered particle flux is at a maximum in this condition. Above an energy level Eo, the backscattered flux falls to zero because Eo is the maximum backscattered energy for a given set up. Curve 63 depicts a wafer oriented so that channeling is maximized, and correspondingly backscattered particle flux is minimized in this condition. With the channeled wafer oriented for maximum channeling, backscattered particle flux falls to zero at the same ion beam energy level Eo as does the unchanneled wafer depicted by curve 61.

Backscattered ion intensity may be measured during set up for processing runs to verify that wafers 26 are properly oriented with the ion beam 24 as the cut of the wafer introduces variations in crystalline lattice structure alignment and the ion beam path drifts during processing. During this set up the support 33 is tilted about the first and second twist axes 46, 48 until channeling is maximized (curve 63) and then the angles of incidence varied a small (less than 10 degrees) amount about combination of the first and second twist axes. Backscattered ion intensity may also be used to verify the ion beam energy. By measuring the energy of the backscattered ions 25a, and knowing the mass of the species of ion making up the ion beam 24 and the angle of incidence between the beam and the crystal structure, the ion beam energy may be determined by dividing the backscattered ion energy by a kinematic factor for the species making up the ion beam.

The present invention has been described with a degree of particularity. It is the intent, however, that the invention include all modifications or alterations of the disclosed preferred embodiment falling within the spirit or scope of the appended claims.

We claim:

1. A method for use in calibrating an orientation of a workpiece support of an ion implantation process, the method comprising the steps of:
   a) producing a concentration of ions in an ion source chamber and generating an ion beam;
   b) positioning a workpiece support at a predetermined orientation to intersect the ion beam;
   c) mounting the one or more workpieces on the workpiece support;
   d) treating the one or more workpieces by causing the ion beam to impact the one or more workpieces;
   e) measuring the count of backscattered ions from the one or more workpieces;
   f) adjusting the orientation of the workpiece support to chance an implantation angle of incidence between the ion beam and the one or more workpieces based on the count of backscattered ions, the count of backscattered ions varying with the implantation angle of incidence; and
   g) using the adjusted orientation of the workpiece support for ion implantation of the one or more workpieces by the ion beam.

2. The method of claim 1 wherein the step of adjusting an orientation of the workpiece support includes the steps of:
   1) adjusting the orientation of the workpiece support to determine an implantation angle of incidence that minimizes the count of backscattered ions and using the orientation that minimizes the count as a reference point orientation, channeling of the one or more workpieces being a maximum at the reference point orientation; and
   2) further adjusting the orientation of the workpiece support with respect to the reference point orientation to increase the count the backscattered ions and thereby reduce channeling of the one or more workpieces.

3. The method of claim 1 wherein the step of adjusting the orientation of the workpiece support further includes the step of determining an implantation angle of incidence that maximizes backscattered ion energy and using the maximum backscattered ion energy detected to calculate ion beam energy.

4. The method of claim 3 wherein the step of using the maximum backscattered ion energy to calculate the ion beam energy further comprises dividing the maximum backscattered ion energy by a kinematic factor for a type of ion beam used.

5. The method of claim 1 wherein the workpiece support is rotatable and wherein the step of treating the one or more workpieces includes the step of rotating the workpiece support such that the ion beam impacts the one or more workpieces.

6. A method for use in calibrating an orientation of a workpiece support of an ion implantation process to achieve a desired implantation angle of incidence between an ion beam and one or more workpieces being implanted by the ion beam, the method comprising the steps of:
   a) producing a concentration of ions in an ion source chamber and generating the ion beam;
   b) positioning a workpiece support at a predetermined orientation with respect to the ion beam;
   c) mounting the one or more workpieces on the workpiece support;
   d) treating the one or more workpieces by causing the ion beam to impact the one or more workpieces;
   e) measuring the count of backscattered ions from the one or more workpieces;
   f) adjusting the orientation of the workpiece support with respect to the ion beam to achieve the desired implantation angle of incidence between the ion beam and one or more workpieces, the count of backscattered ions varying with the implantation angle of incidence; and
   g) using the adjusted orientation of the workpiece support for ion implantation of the one or more workpieces by the ion beam.

7. The method of claim 6 wherein the step of adjusting an orientation of the workpiece support includes the steps of:
   1) adjusting the orientation of the workpiece support to determine an implantation angle of incidence that minimizes the count of backscattered ions and using the orientation that minimizes the count as a reference point orientation, channeling of the one or more workpieces being a maximum at the reference point orientation; and 2) further adjusting the orientation of the workpiece support with respect to the reference point orientation to increase the count the backscattered ions and thereby reduce channeling of the one or more workpieces.

8. The method of claim 6 wherein the step of adjusting the orientation of the workpiece support further includes the step of determining an implantation angle of incidence that maximizes backscattered ion energy and using the maximum backscattered ion energy detected to calculate ion beam energy.

9. The method of claim 8 wherein the step of using the maximum backscattered ion energy to calculate the ion beam energy further comprises dividing the maximum backscattered ion energy by a kinematic factor for a type of ion beam used.

10. The method of claim 9 wherein the ion beam is a boron ion beam and the kinematic factor is 0.8.

11. The method of claim 6 wherein the workpiece support is rotatable and wherein the step of treating the one or more workpieces includes the step of rotating the workpiece support such that the ion beam impacts the one or more workpieces.

12. An ion implantation system for causing ions of an ion beam to impact an implantation surface of one or more workpieces, the ion implantation system comprising:
   a) a process chamber defining a chamber interior into which one or more workpieces can be inserted for ion treatment;
   b) a workpiece support within the process chamber for mounting one or more workpieces to be impacted by the ion beam, the support being movable with respect to the ion beam thereby permitting adjustment of an orientation of the workpiece support with respect to the ion beam;
   c) an energy source for setting up an ion plasma;
   d) an ion acceleration means for causing ions from the plasma to form the ion beam to impact the one or more workpieces;
   d) a Rutherford backscattering detector for measuring a count of backscattered ions from the one or more workpieces; and
   e) a control means for adjusting the orientation of the workpiece support to change an implantation angle of incidence between the ion beam and the one or more workpieces based on a count of backscattered ions to achieve a desired implantation angle of incidence, the count of backscattered ions varying with the implantation angle of incidence.

13. The system of claim 12 wherein the detector includes a rotatable disc-shaped shield having a radial slot therein.

14. The system of claim 12 wherein the control means includes a time synchronized electronic filter to compensate for the effects of the rotating workpiece.

15. The system of claim 14 wherein the electronic filter is used to limit data intake to data generated when the ion beam impacts the center of a desired set of workpieces.

16. The system of claim 12 wherein the detector shield comprises a closeable shutter which covers a detecting surface of the detector.

17. The system of claim 12 wherein the workpiece support is rotatable and the count of backscattered ions is measured while the workpiece support is rotating.

18. An ion implantation system for causing ions to impact an implantation surface of one or more workpieces comprising:
   a) a process chamber defining a chamber interior into which one or more workpieces can be inserted for ion treatment;
   b) a rotating workpiece support within the process chamber for mounting one or more workpieces to be impacted;
   c) an energy source for setting up an ion plasma;
   d) an ion acceleration means for causing ions from the plasma to impact the one or more workpieces;
   d) a Rutherford backscattering detector for measuring a count of backscattered ions from the one or more workpieces, the detector including a rotatable disc-shaped shield having a radial slot therein; and
   e) a control means for controlling the position of the workpiece support based on the measured count of the backscattered ions.

19. The system of claim 18 wherein the control means includes a time synchronized electronic filter to compensate for the effects of the rotating workpiece.

20. The system of claim 19 wherein the electronic filter is used to limit data intake to data generated when the ion beam impacts the center of a desired set of workpieces.

21. The system of claim 18 wherein the detector shield comprises a closeable shutter which covers a detecting surface of the detector.

* * * * *